(12) United States Patent
Rosenberg et al.

(10) Patent No.: US 8,098,492 B2
(45) Date of Patent: Jan. 17, 2012

(54) DATA PROCESSING MODULES AND SYSTEMS

(75) Inventors: Paul Rosenberg, Sunnyvale, CA (US);
 Sagi Mathai, Palo Alto, CA (US);
 Michael Tan, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 646 days.

(21) Appl. No.: 12/263,374

(22) Filed: Oct. 31, 2008

(65) Prior Publication Data

US 2009/0244855 A1 Oct. 1, 2009

Related U.S. Application Data

(60) Provisional application No. 61/041,198, filed on Mar. 31, 2008.

(51) Int. Cl.
 *H05K 1/14* (2006.01)
(52) U.S. Cl. ........................................ 361/736

(58) Field of Classification Search .................. 361/686, 361/727, 753, 756, 788
See application file for complete search history.

(56) References Cited

U.S. PATENT DOCUMENTS

| | | | |
|---|---|---|---|
| 3,833,836 A | 9/1974 | Moksu | |
| 4,738,632 A * | 4/1988 | Schmidt et al. | 439/341 |
| 4,975,803 A | 12/1990 | Niggemann | |
| 5,861,873 A * | 1/1999 | Kikinis | 345/157 |
| 6,551,111 B1 * | 4/2003 | Watanabe | 439/11 |
| 6,619,858 B1 | 9/2003 | Lytel | |
| 6,742,069 B2 * | 5/2004 | Papa et al. | 710/302 |
| 6,872,007 B2 | 3/2005 | Botham | |
| 7,035,549 B2 | 4/2006 | Davies | |
| 7,039,265 B2 | 5/2006 | Levy | |
| 7,042,737 B1 * | 5/2006 | Woolsey et al. | 361/799 |
| 7,225,239 B2 * | 5/2007 | King et al. | 709/220 |
| 7,251,388 B2 | 7/2007 | Morris | |
| 2005/0111200 A1 * | 5/2005 | Hardt et al. | 361/727 |
| 2005/0146855 A1 * | 7/2005 | Brehm et al. | 361/724 |
| 2006/0034061 A1 * | 2/2006 | Grundy et al. | 361/785 |

* cited by examiner

*Primary Examiner* — Lisa Lea Edmonds
*Assistant Examiner* — Xanthia C Cunningham

(57) ABSTRACT

Data processing modules including a housing and connectors carried by the housing, and systems including the same.

20 Claims, 9 Drawing Sheets

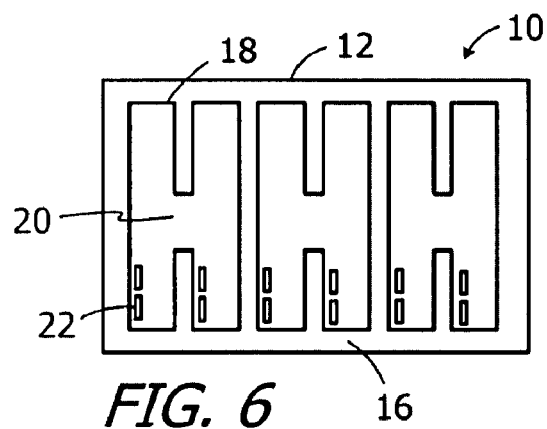
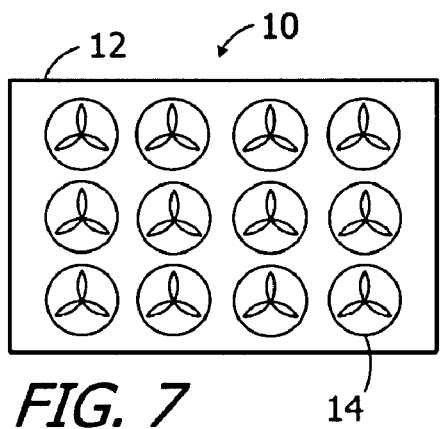
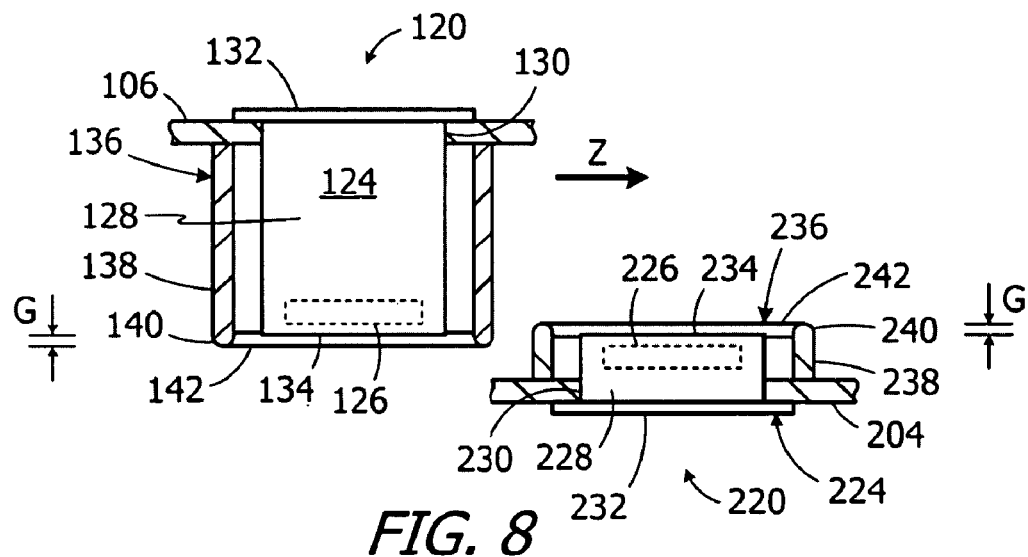
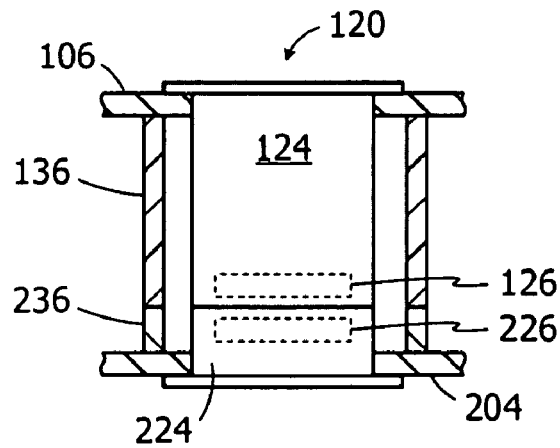

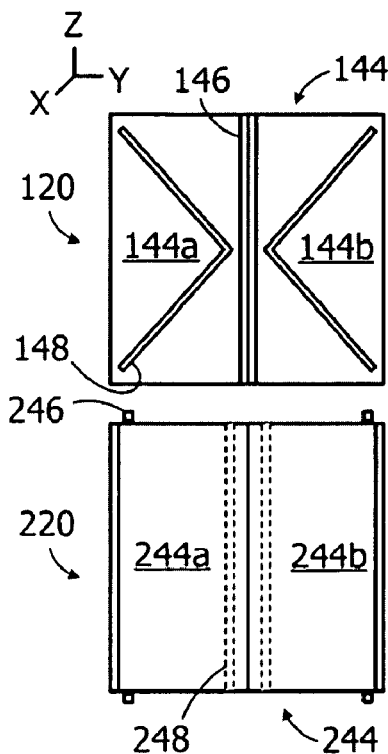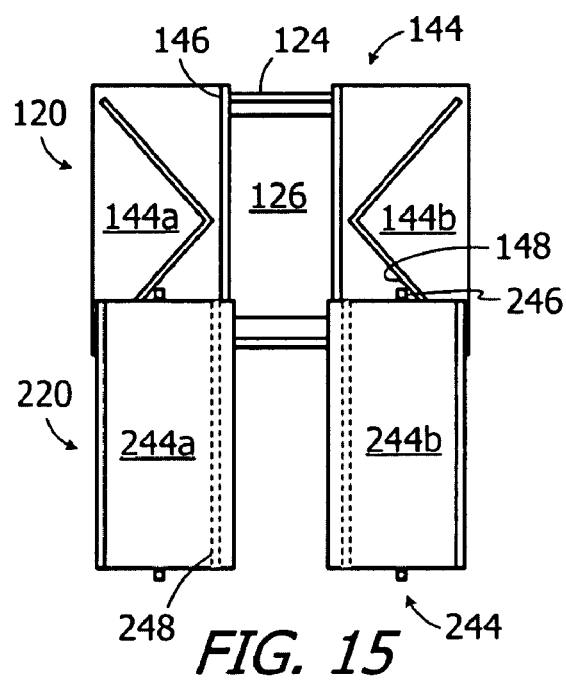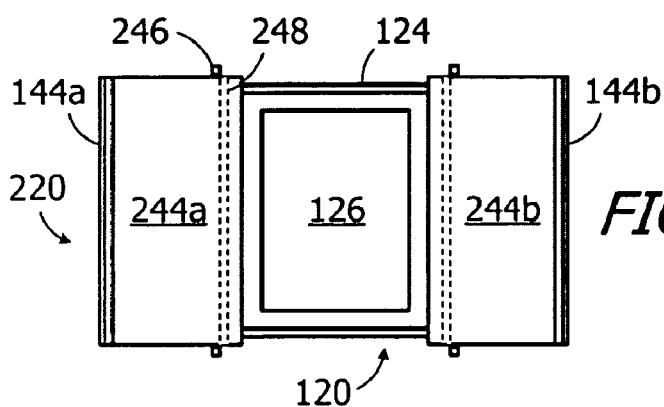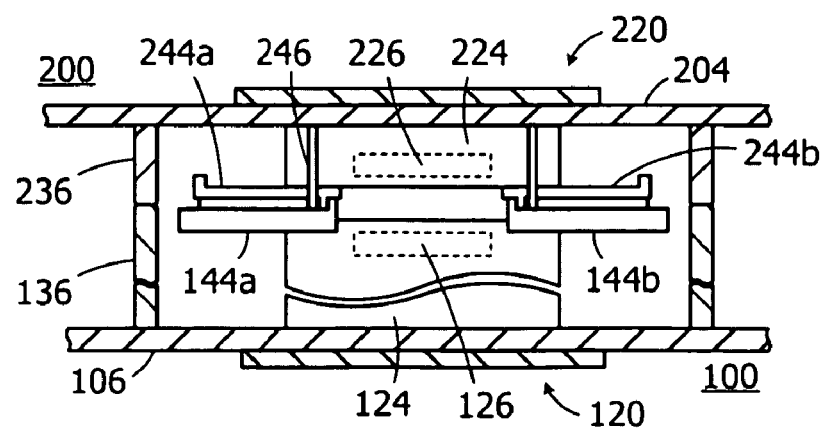
FIG. 14
FIG. 15
FIG. 16
FIG. 17

DATA PROCESSING MODULES AND SYSTEMS

CROSS-REFERENCE TO RELATED APPLICATION

The present application claims priority from provisional application Ser. No. 61/041,198, filed Mar. 31, 2008, the contents of which are incorporated herein by reference in their entirety.

BACKGROUND OF THE INVENTIONS

Although the present inventions are not limited thereto, a blade server is one example of a data processing system in which data transfer can be problematic. Blade servers are comprehensive computing systems that include processors and other application specific integrated circuits (ASICs), memory, storage, and associated electronics all on a circuit board within a blade housing. One or more server blades may be contained in an enclosure, along with server appliance blades, network-switch blades, storage blades, management blades, local-area-network (LAN) blades, and other blades. An ASIC may include one or more data processors which perform data processing operations in parallel with one or more ASICs on the same circuit board and which may communicate with the ASICs of other circuit boards in the system. The rearward end of the blades frequently includes connectors that mate with backplane connectors on the chassis within the enclosure when the blades are inserted into the enclosure. With respect to cooling, many blade server enclosures include fans or other blowers which create airflow. The air typically flows from the forward end of the blades to rearward end and over the electronic components.

The data communication between the blades is often through metal-based backplane data connections. One issue associated with metal-based backplane data connections stems from the fact that increases in data transfer may necessitate larger backplane data connectors, which can interfere with the air flow that is required for cooling. Optical backplane connections have also been proposed. However, in order to accommodate optical backplane connections, the associated enclosure must have an optical pathway routed through backplane, which can be expensive because it requires costly coupling components, and is inefficient in terms of the link budget and power consumption.

BRIEF DESCRIPTION OF THE DRAWINGS

Detailed description of embodiments will be made with reference to the accompanying drawings.

FIG. 6 is a front view of a blade server enclosure in accordance with one embodiment of a present invention.

FIG. 7 is a rear view of the blade server enclosure illustrated FIG. 6.

FIG. 8 is a section view of connector assemblies in accordance with one embodiment of a present invention in an unconnected state.

FIG. 9 is a section view of the connector assemblies illustrated in FIG. 8 in a connected state.

FIGS. 14-16 are plan views showing one aspect of the interaction between the connector assemblies illustrated in FIGS. 10-13.

FIG. 17 is a section view showing the connector assemblies illustrated in FIGS. 10-13 in an aligned state.

DETAILED DESCRIPTION OF THE EMBODIMENTS

The following is a detailed description of the best presently known modes of carrying out the inventions. This description is not to be taken in a limiting sense, but is made merely for the purpose of illustrating the general principles of the inventions. It is noted that detailed discussions of aspects of electronic components, systems and apparatus that are not required for the understanding of the present inventions have been omitted for the sake of simplicity. The present inventions are also applicable to a wide range of electronic components, systems and apparatus, including those presently being developed or yet to be developed.

The present data processing systems include a plurality of data processing modules that are configured to communicate directly (e.g. communication that does not occur by way of backplane and/or mid-plane connectors) with one or more adjacent data processing modules. The direct module-to-module communication may be side-to-side, top-to-bottom, front-to-back and/or any combination thereof. The communication may be facilitated by connector assemblies that are supported at least in part by the data processing module housing. As such, the data processing module housing may be use to provide the coarse alignment of the connector assemblies. Alternatively, or in addition, the communication may be facilitated by connector assemblies which have structures that are movable towards adjacent modules. The connector assemblies associated with the modules in a particular system may have different configurations from module-to-module or the same configuration in each module. The modules may be configured such that they define two-module pairs in the context of direct module-to-module communication, or may be configured such that module-to-module communication may occur in series between more than two modules.

A blade server is but one example of a data processing system that has a plurality of data processing modules (i.e. the individual blades) and, although the present inventions are described in the context of blade servers, the present inventions are not limited to blade servers.

Figure 1:
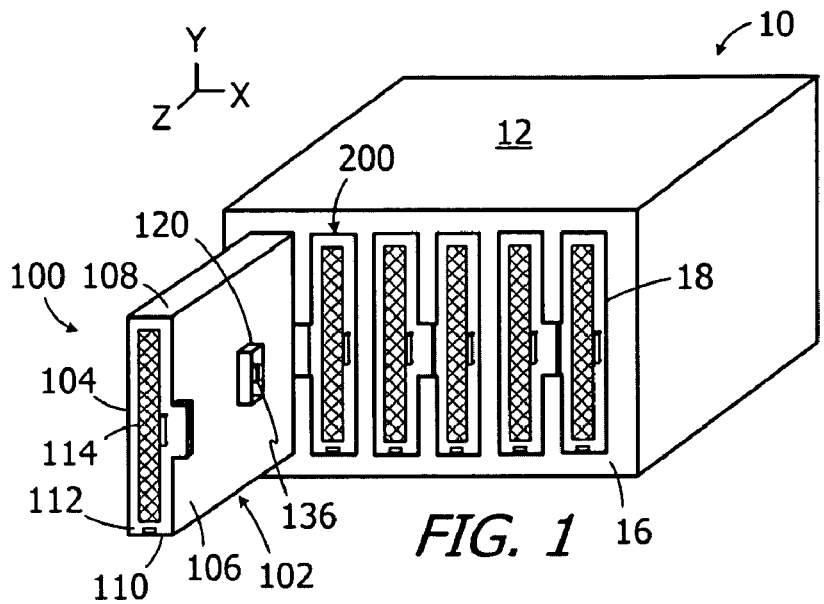
FIG. 1 is a front perspective view of a blade server in accordance with one embodiment of a present invention.
Figure 2:
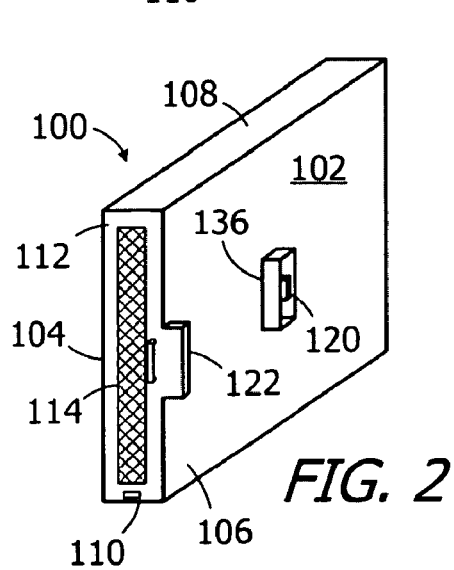
FIG. 2 is a front perspective view of a server blade in accordance with one embodiment of a present invention.
Figure 3:
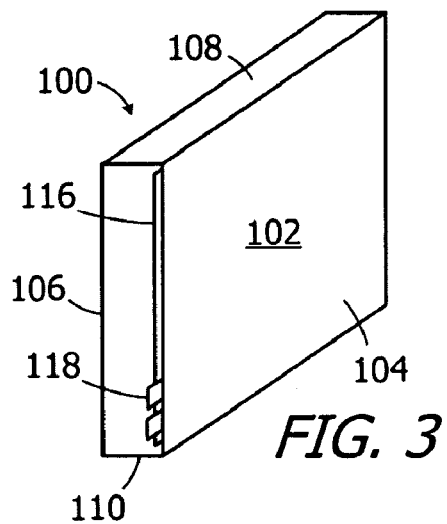
FIG. 3 is a rear perspective view of the server blade illustrated in FIG. 2.
Figure 4:
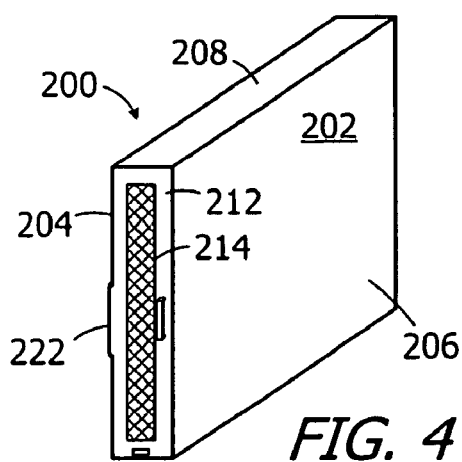
FIG. 4 is a front perspective view of a server blade in accordance with one embodiment of a present invention.
Figure 5:
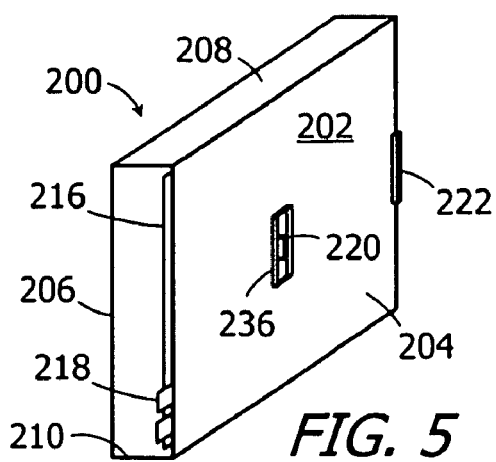
FIG. 5 is a rear perspective view of the server blade illustrated in FIG. 4.

One example of a blade server in accordance with one embodiment of a present invention is generally represented by reference numeral 10 in FIG. 1. The exemplary blade server 10 includes a plurality of server blades ("blades") 100 and 200 that may be removably mounted within an enclosure 12. The blades 100 and 200, which are also illustrated in FIGS. 2-5, are configured to be connected to one another in individual blade 100/blade 200 pairs as well as to the remainder of the server 10. To that end, each blade 100 includes a housing 102, which consists essentially of side walls 104 and 106, a top wall 108, a bottom wall 110, and a front wall 112 with an inlet 114. Suitable materials for the blade housing 102 include sheet metal and hard plastic. Each blade 100 also includes a circuit board 116, various ASICs and/or other electronic components 117 (FIG. 18) on the circuit board, electrical connectors 118 (power and/or data) that connect the blade to the remainder of the server 10 by way of enclosure connectors 22 (FIG. 6) when the blades are fully inserted (FIG. 1), and a connector assembly 120 that connects the blade 100 to an adjacent blade 200. A portion of the connector assembly 120 may be fixedly secured to, an integral part of, or otherwise closely linked with the blade housing 102.

Similarly, each blade 200 includes a housing 202, which consists essentially of side walls 204 and 206, a top wall 208, a bottom wall 210, and a front wall 212 with an inlet 214. Suitable materials for the blade housing 202 include sheet metal and hard plastic. Each blade 200 also includes a circuit board 216, various ASICs and/or other electronic components 217 (FIG. 21) on the circuit board, electrical connectors 218 (power and/or data) that connect the blade to the remainder of the server 10 by way of enclosure connectors 22 (FIG. 6) when the blades are fully inserted (FIG. 1), and a connector assembly 220 that connects the blade 200 to an adjacent blade 100. A portion of the connector assembly 220 may be fixedly secured to, an integral part of, or otherwise closely linked with the blade housing 202.

The connector assemblies 120 and 220 in the exemplary embodiment are positioned relative to the remainder of the blades 100 and 200, and the server enclosure 12 is configured, such that the connector assemblies will be aligned with one another when the blades are fully inserted into the enclosure 12. Such alignment of the connector assemblies 120 and 220 as a whole is referred to herein as "coarse alignment." Additional alignment of particular elements within the connector assemblies 120 and 220, which is referred to herein as "fine alignment," is accomplished in the manner described below with reference to FIGS. 18-27B.

With respect to the cooling of the blades 100 and 200, the rear of the enclosure 12 includes a plurality of fans 14 (FIG. 7). The fans 14 draw air into the blades 100 and 200 by way of the inlets 114 and 214 and pull the air through the interior of the housings 102 and 202 in a direction that is parallel to the surface of the circuit boards 116 and 216. Other devices that may be used to force air though the blades 100 and 200 include, but are not limited to, a central high pressure, high flow rate pump such as a kinetic or positive displacement device (e.g. a centrifugal fan or piston-type device) with ducts that direct the air to the inlets 114 and 214 of the individual blades.

In the illustrated embodiment, the connector assembly 120 projects outwardly from the housing side wall 106 in the blade 100, while the connector assembly 220 project outwardly from the housing side wall 204 in the blade 200. As such, and referring to FIGS. 1 and 6, the server enclosure front wall 16 includes a plurality of openings 18 that are each configured to receive a matched pair of blades (i.e. a blade 100 and a blade 200). Each opening 18 has a central area 20 that permits passage of the outwardly projecting connector assemblies 120 and 220. The central areas 20 are sealed by housing flanges 122 and 222 (FIGS. 2 and 5) after the associated blades 100 and 200 have been fully inserted into the enclosure 12.

Turning to FIGS. 8 and 9, and although the present inventions are not so limited, the exemplary connector assemblies 120 and 220 each include a housing 124 and 224 and a proximity coupler 126 and 226. The connector assembly housings 124 and 224 may be fixedly secured to, an integral part of, or otherwise closely linked with the associated blade housings 102 and 202, in general, and the walls 106 and 204 in particular. In the illustrated embodiment, the connector assembly housings 124 and 224 includes walls 128 and 228 that extend through openings 130 and 230 and retainer lips 132 and 232 that are positioned against the inner surface of the blade housing walls 106 and 204. Each connector assembly housing 124 and 224 may include a single wall 128 and 228 in those instances where the housing has a circular or otherwise curved shape, or a plurality of walls in those instances where the housing shape is defined by a plurality of sides (e.g. the illustrated square shape in cross-section). The connector assembly housings 124 and 224 may be secured to the blade housings 102 and 202 though the use of dimple-like projections (not shown) located on the walls 128 and 228 adjacent to the inner surfaces of the blade housing side walls 106 and 204, other mechanical fasteners, adhesives, welding or any other suitable instrumentality. Suitable materials for the connector assembly housings 124 and 224 include sheet metal and hard plastic.

At least a portion of each of the proximity couplers 126 and 226, which are connected to the circuit boards 116 and 216 and are discussed in greater detail below with reference to FIGS. 18-27B, is positioned just inwardly of the free ends 134 and 234 of the associated housings 124 and 224. The respective configuration of the blades 100 and 200 and the server enclosure 12 is such that the free ends 134 and 234 of the housings 124 and 224 will engage one another, or at least be in close proximity to one another, after one or both of the connector assemblies 120 and 220 moves in the Z-direction (in the orientation illustrated in FIG. 1) from a non-aligned orientation (FIG. 8) to the aligned orientation (FIG. 9). Once the housings 124 and 224 are aligned, the proximity couplers 126 and 226 may be used to form a high bandwidth data connection between the blades 100 and 200. To that end, the free ends 134 and 234 may simply be the ends of the walls 128 and 228, or the connector assembly housings 124 and 224 may be provided with covers that open as part of the alignment process and define the free ends. An exemplary cover arrangement is discussed below with reference to FIGS. 10-17.

The exemplary blade housings 102 and 202 illustrated in FIGS. 8 and 9 are also provided with gaskets 136 and 236 that surround the connector assemblies 120 and 220. The gaskets 136 and 236 in the exemplary embodiment are resilient electromagnetic containment (EMC) gaskets that are secured to the outer surface of the blade housing walls 106 and 204. The gaskets 136 and 236 include main walls 138 and 238 and rounded engagement surfaces 140 and 240. There is a small gap G (FIG. 8) between the free ends 134 and 234 of the connector assembly housings 124 and 224 and the free ends 142 and 242 of the engagement surfaces 140 and 240. The resilient EMC gaskets 124 and 224 will, therefore, compress slightly when they move from a non-aligned orientation (FIG. 8) to the aligned orientation (FIG. 9). As the result of the tight fit created by their compression, and the fact they surround the connector assemblies, the EMC gaskets 124 and 224 also function as a dust shield.

Figure 10:
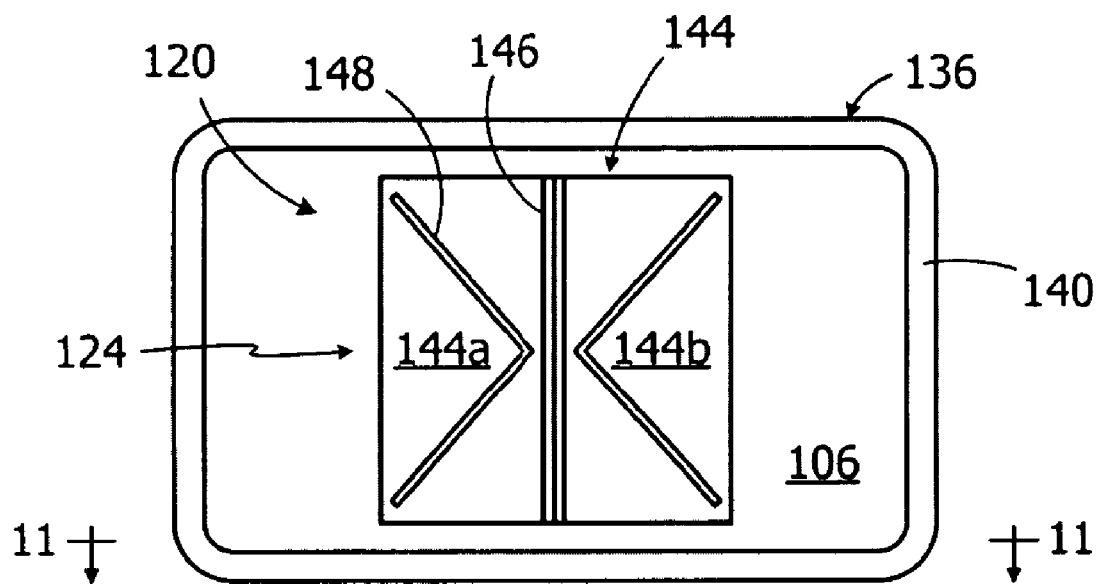
FIG. 10 is a plan view of a connector assembly in accordance with one embodiment of a present invention.
Figure 11:
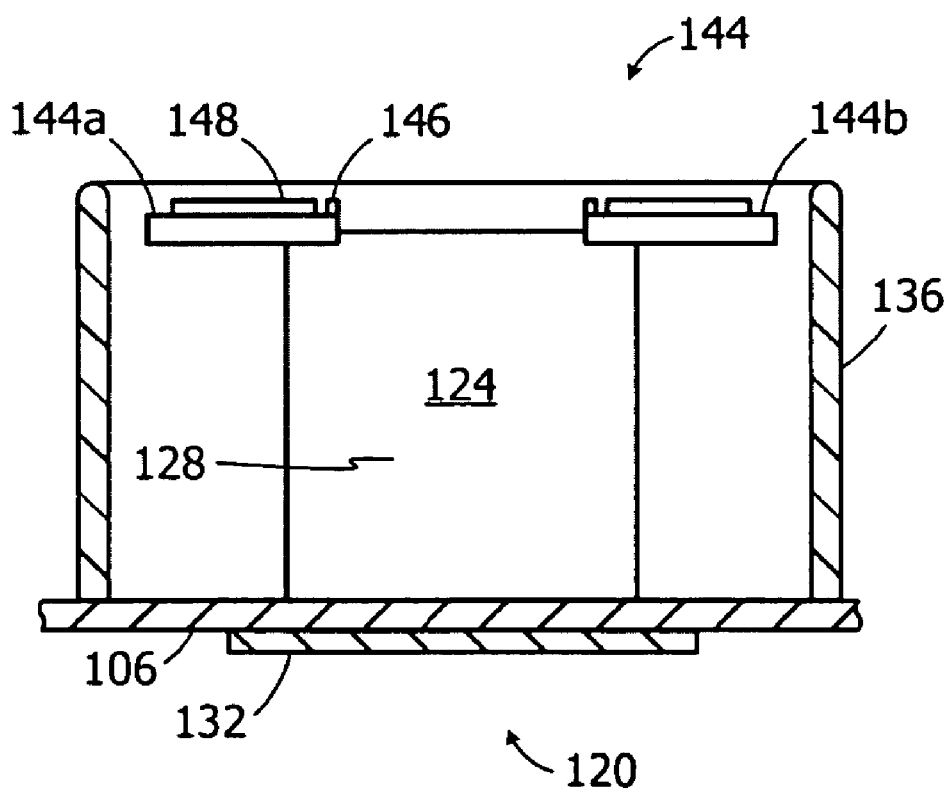
FIG. 11 is a section view taken along line 11-11 in FIG. 10 showing the connector assembly illustrated in FIG. 10 with the cover opened.

As noted above, connector assembly housings in accordance with at least some of the present inventions may include covers that are configured to open as part of the connector assembly alignment process. For example, the connector assembly housings may have covers that are pushed open as the connector assemblies are moved to the aligned orientation illustrated in FIG. 9. In some implementations, the structures that perform the function of opening the covers may be part of the server enclosure 12. In the illustrated embodiment, however, the connector assembly housings 124 and 224 include structures which perform the function of opening the covers. Referring first to FIGS. 10 and 11, the exemplary connector assembly housing 124 includes a cover 144 with a pair of identical cover members 144a and 144b that are slidably secured to one or more of the connector assembly housing walls 128 (e.g. with a rail and slot arrangement) and are movable between the fully closed position (FIG. 10) and the fully open position (FIG. 11). Biasing elements such as springs (not shown) may be provided to bias the cover members 144a and 144b to the closed position. Each of the cover members 144a and 144b is also provided with structures, such as the exemplary contact elements 146 and drive elements 148, that interact with structures associated with the connector assembly 220 in such a manner that the cover 144 will open during the alignment process, as is described below with reference to FIGS. 14-17.

Figure 12:
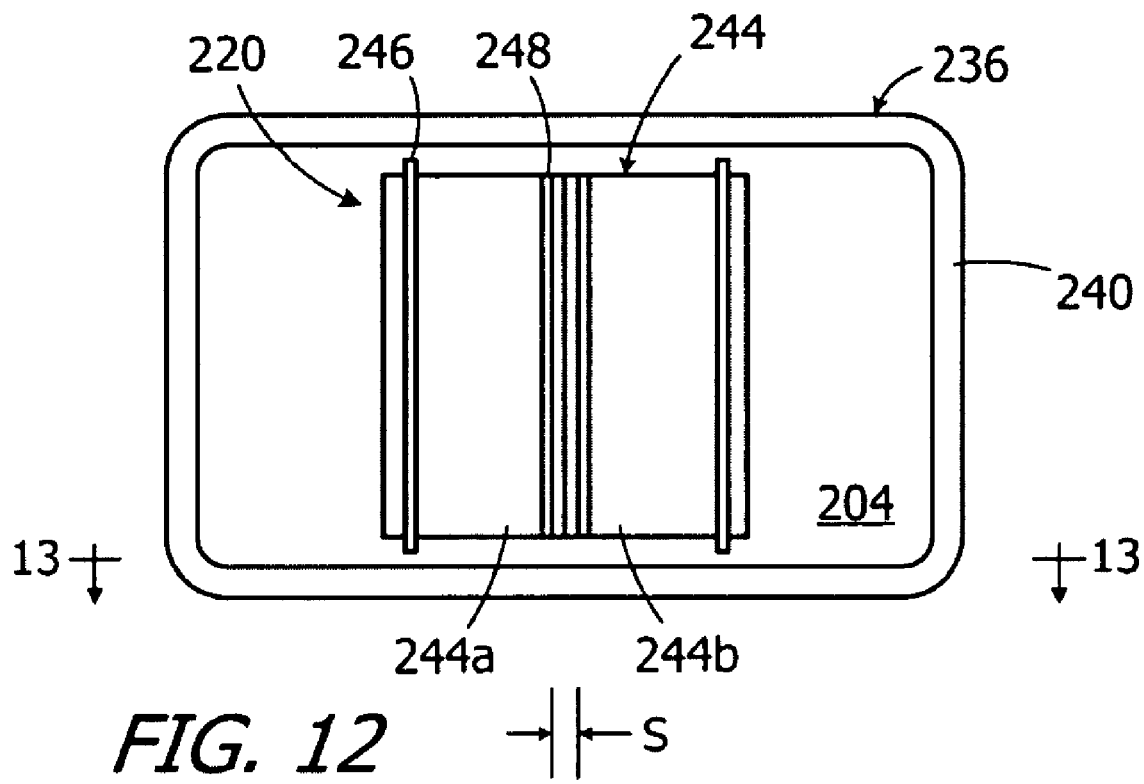
FIG. 12 is a plan view of a connector assembly in accordance with one embodiment of a present invention.
Figure 13:
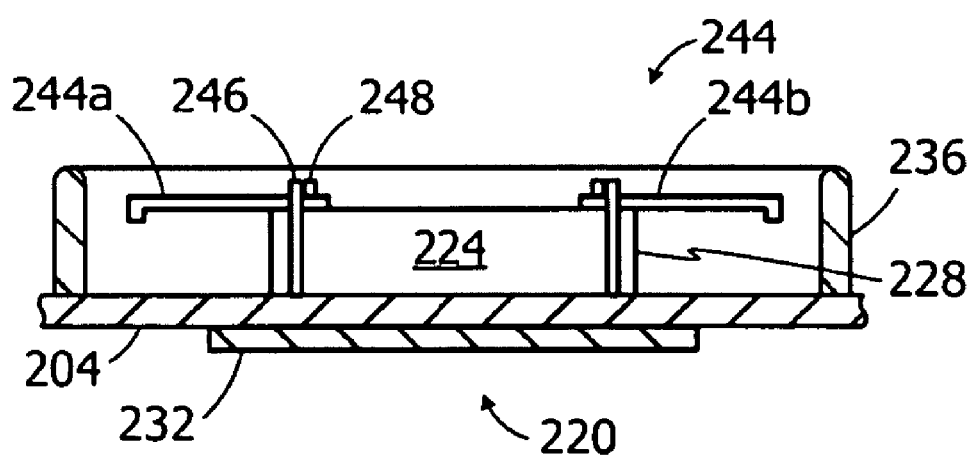
FIG. 13 is a section view taken along line 13-13 in FIG. 12 showing the connector assembly illustrated in FIG. 12 with the cover opened.

Turning to FIGS. 12 and 13, the exemplary connector assembly housing 224 includes a cover 244 with a pair of identical cover members 244a and 244b that are slidably secured to one or more of the connector assembly housing walls 228 (e.g. with a rail and slot arrangement) and are movable between the fully closed position (FIG. 12) and the fully open position (FIG. 13). Biasing elements such as springs (not shown) may be provided to bias the cover members 244a and 244b to the closed position. The connector assembly 220 is also provided with structures, such as the exemplary contact elements 246, which may be immovably secured to the blade housing wall 204 (as shown) or to the connector assembly housing 224, and drive elements 248 on the cover members 244a and 244b, that interact with structures on the connector assembly 120 in such a manner that the cover 244 will open during the alignment process. With respect to this interaction, there is a space S between the drive elements 248 that is wide enough to accommodate the contact elements 146 of the connector assembly 120.

Top views of the cover 144 and a bottom views of the cover 244 and contact elements 246 are presented in FIGS. 14-17. Connector assembly 220 is represented solely by the cover 244 and the contact elements 246 in FIGS. 14-17. In FIG. 14, the exemplary connector assemblies 120 and 220 are spaced in the direction of movement into the server enclosure 12 (the Z-direction in the orientation illustrated in FIG. 1) and no portion of one is aligned with the other. As the connector assemblies 120 and 220 move to the partially aligned orientation illustrated in FIG. 15, the contact elements 246 associated with connector assembly 220 engage the drive elements 148 on the cover members 144a and 144b, which are associated with connector assembly 120. Due to the fact that the drive elements 148 are oriented in a direction that is transverse to the direction of relative connector assembly movement (here, the Z-direction), the cover members 144a and 144b are slidable in a direction (here, the Y-direction) that is perpendicular to the direction of relative connector assembly movement, and the contact elements 246 are fixedly positioned on the blade 200, the cover members 144a and 144b will move in opposite directions along the Y-axis. As this occurs, the contact elements 146 on the cover members 144a and 144b will engage the drive elements 248 on the cover members 244a and 244b and push the cover members 244a and 244b in opposite directions along the Y-axis. The movement of the cover members 144a, 144b, 244a and 244b will continue until they are fully opened. The full opening of the cover members 144a, 144b, 244a and 244b occurs, in the illustrated embodiment, prior to the connector assemblies 120 and 220 being fully aligned with one another (FIGS. 16 and 17) so that covers 144 and 244 will not interfere with the proximity couplers 126 and 226 as they couple in the manner described below with reference to FIG. 22.

A wide variety of proximity couplers may be employed in the present connector assemblies. One specific example of a proximity coupler is generally represented by reference numeral 126 in FIGS. 18-20. The exemplary proximity coupler 126 is a high bandwidth coupler which includes a base unit 150 that is mounted on the circuit board 116, a head unit 152 and a connection/suspension system 154 that optically and/or electrically connects the base unit to the head unit and suspends the head unit near the cover 144 in such a manner that the head unit is movable in the X-direction (in the orientation illustrated in FIG. 1).

The particular configuration of the base unit 150 and head unit 152 will depend on the type of high bandwidth coupling that is to be employed. Optical coupling is employed in the illustrated embodiment and the base unit 150 includes optoelectronic components (e.g. emitters, detectors, lenses, and associated circuitry), the head unit 152 includes a lens array, and the connection/suspension system 154 is provided with a flexible optical cable 156 that extends from the base unit to the head unit. One specific example of the head unit 152 is described below with reference to FIGS. 23-27B.

Figure 18:
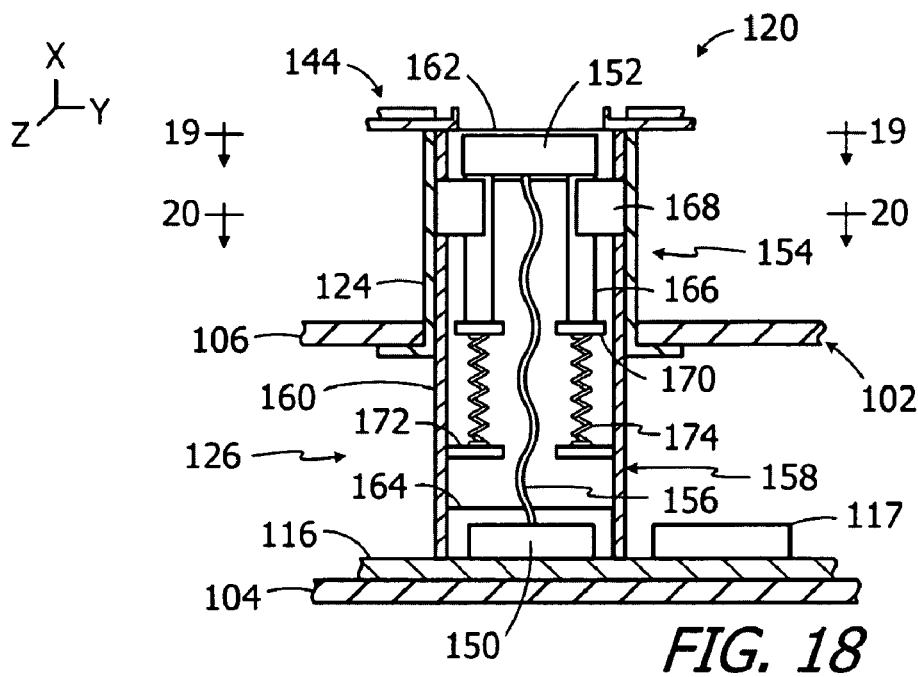
FIG. 18 is a side, partial section view of a server blade including the connector assembly illustrated in FIGS. 10 and 11.
Figure 19:
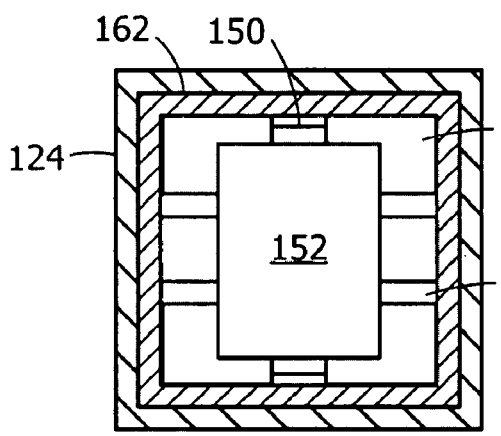
FIG. 19 is a section view taken along line 19-19 in FIG. 18.
Figure 20:
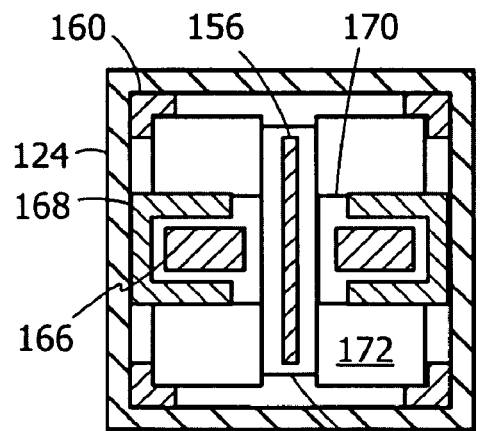
FIG. 20 is a section view taken along line 20-20 in FIG. 18.

In addition to the flexible optical cable 156, the exemplary connection/suspension system 154 illustrated in FIGS. 18-20 includes a frame 158 that may be secured to the circuit board 116 and/or to the inner surface of the connector assembly housing 124. The exemplary frame 158 consists of four beams 160 and a pair of end members 162 and 164 that connect the beams to one another. The head unit 152 is carried on a pair of posts 166 which are slidably mounted within U-shaped channels 168 that are secured to the frame end member 162. Each post 166 has a base 170. Tension springs 174, which hold the head unit in the position illustrated in FIG. 18 with a relatively small force, are secured to the post bases 170 as well as to a pair of spring supports 172 that are secured to the frame 158. The tension springs 174 allow the head unit 152 to move in the X-direction when a force is applied thereto, and then return the head unit to the position illustrated in FIG. 18 when the force is no longer sufficient to overcome the biasing force associated with the tension springs.

Referring more specifically to FIG. 20, there is an approximately 1 mm gap between the inner surfaces of the U-shaped channels 168 and the posts 166 in the illustrated implementation in order to account for manufacturing tolerances associated with the system 10. The head unit 152 is, as a result of the gap, free to move up to about 2 mm in the Y and Z-directions relative to the remainder of the blade 100. This freedom of movement facilitates coupling of the head units 152 and 252 in the manner described below with reference to FIG. 22 despite minor misalignments of the connector assemblies 120 and 220 (i.e. misalignments of up to about 2 mm).

Figure 21:
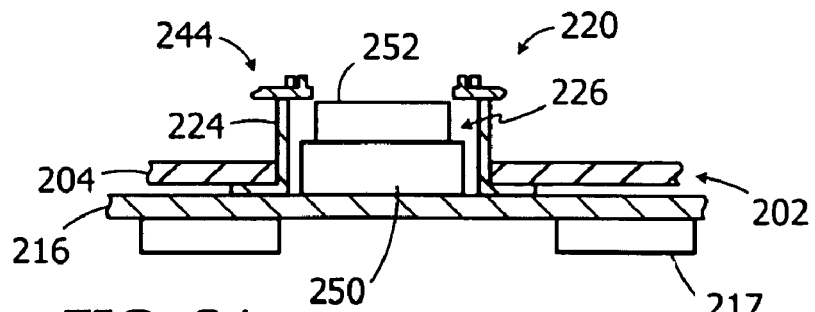
FIG. 21 is a side, partial section view of a server blade including the connector assembly illustrated in FIGS. 12 and 13.

Turning to FIG. 21, the exemplary proximity coupler 226 is configured to be used in combination with proximity coupler 126 and, accordingly, it is a high bandwidth coupler that includes a base unit 250 that is mounted on the circuit board 216 and a head unit 252. The base unit 250 includes optoelectronic components (e.g. emitters, detectors, lenses, and associated circuitry) and the head unit includes a lens array that is optically coupled to the base unit. Although the head unit 252 may be movable in some embodiments, it is fixed in place in the illustrated embodiment.

Figure 22:
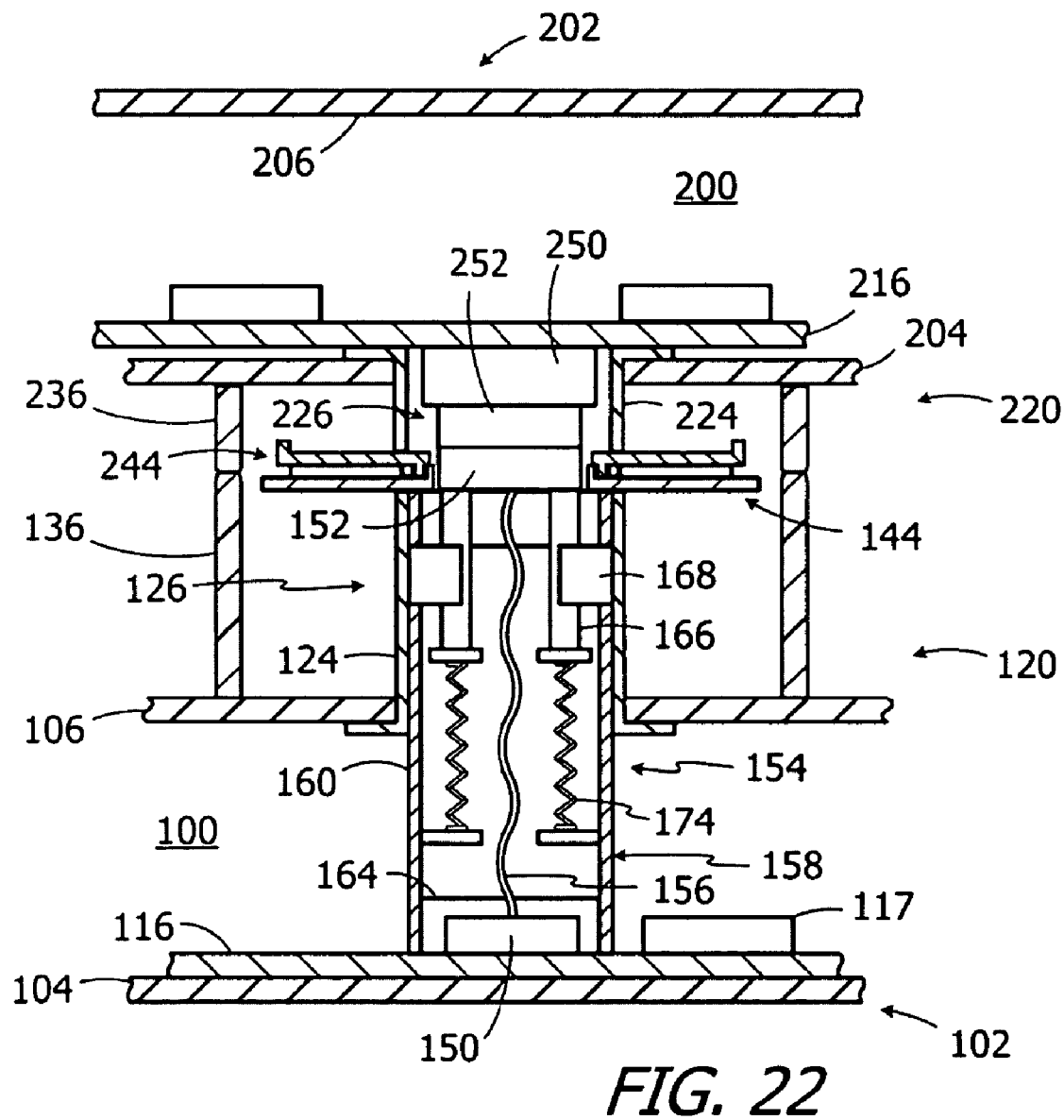
FIG. 22 is a side, partial section view of the server blades illustrated in FIGS. 18-21 in a connected state.

The coupling of the proximity couplers 126 and 226 is illustrated in FIG. 22. More specifically, once the connector assemblies 120 and 220 have moved to the aligned orientation illustrated in FIG. 22, with the covers 144 and 244 in their open state, the head unit 152 of the connector assembly 120 will move into engagement with the head unit 252 to form a high bandwidth connection between the circuit board 116 in blade 100 and the circuit board 216 in blade 200. As is discussed below with reference to FIGS. 23-27B, such head unit movement is, in the illustrated embodiment, the result of magnetic attraction between the head units 152 and 252 that is sufficient to overcome the biasing force of the tension springs 174. In other embodiments, the head units may be brought into contact with one another through the use of solenoids, springs and/or other mechanical or electromechanical apparatus.

Decoupling of the proximity couplers 126 and 226, and disconnection of the connector assemblies 120 and 220, will occur when one of the connected blades 100 and 200 is moved relative to the other in the Z-direction (in the orientation illustrated in FIG. 1). Initially, the head units 152 and 252 will remain coupled. Depending upon the accuracy of the alignment, the head unit 152 may move with the head unit 252 over a short distance (i.e. up to 2 mm in the illustrated embodiment) as the blade 200 is moved, or the head unit 152 may remain with the head unit 252 until the blade 100 has moved the short distance. In either case, and if they are not already engaged, the posts 166 will engage the U-shaped channels 168 and additional movement will cause head units 152 and 252 to pull apart. The tension springs 174 will then pull the head unit 152 back into the connector assembly housing 124. Continued movement will also result in the covers 144 and 244 moving from the open orientation illustrated in FIG. 16, to the partially closed orientation illustrated in FIG. 15 and, finally, to the fully closed orientation illustrated in FIG. 14 due to the above-described biasing force on the cover members 144a-b and 244a-b.

Figure 23:
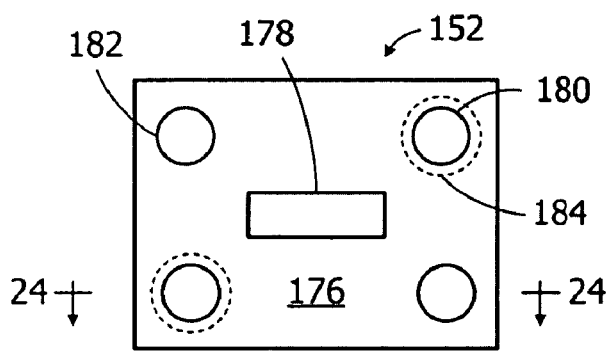
FIG. 23 is a plan view of a proximity coupler in accordance with one embodiment of a present invention.
Figure 24:
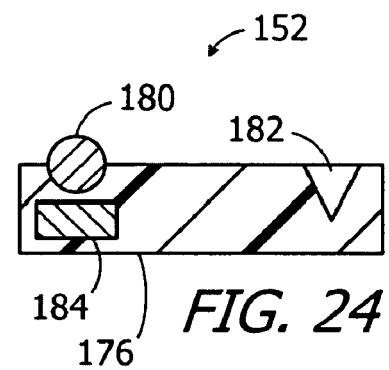
FIG. 24 is a section view taken along line 24-24 in FIG. 23.
Figure 25:
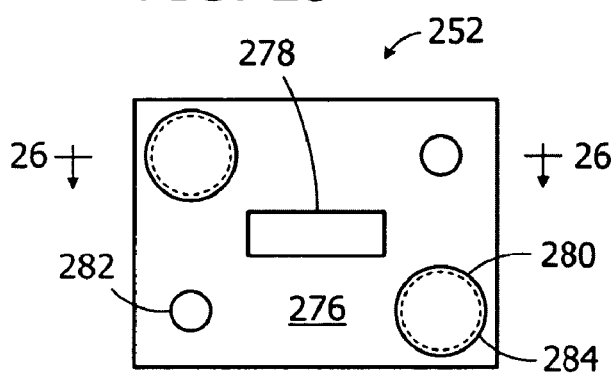
FIG. 25 is a plan view of a proximity coupler in accordance with one embodiment of a present invention.
Figure 26:
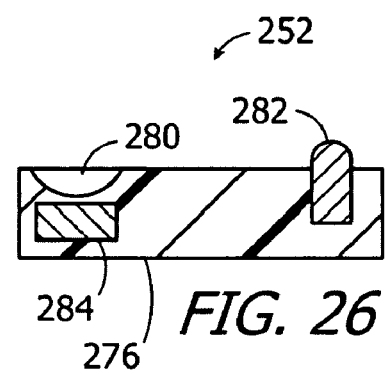
FIG. 26 is a section view taken along line 26-26 in FIG. 25.
Figure 27A:
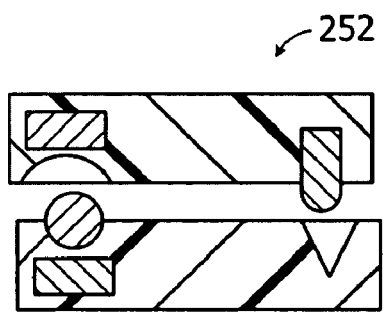
FIG. 27A is a section view showing the couplers illustrated in FIGS. 23-26 in an uncoupled state.
Figure 27B:
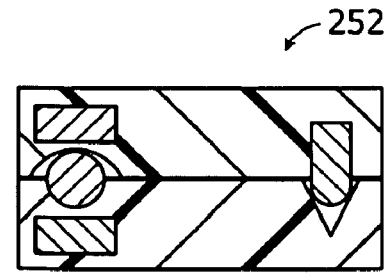
FIG. 27B is a section view showing the couplers illustrated in FIGS. 23-26 in a coupled state.

Although the present inventions are not so limited, the exemplary head units 152 and 252 are self-aligning units that are magnetically attracted to one another. Referring to FIGS. 23 and 24, head unit 152 includes a base 176 (e.g. a molded plastic structure), an optical interface 178 (e.g. a lens array), a pair of spherical alignment elements 180 that are carried on the base such that a hemisphere is exposed, a pair of conical depressions 182 formed in the base, and a pair of magnets 184 that are aligned with the spheres. The head unit 252 illustrated in FIGS. 25 and 26 includes a base 276 (e.g. a molded plastic structure), an optical interface 278 (e.g. a lens array), a pair of tapered depressions 280 with depths sufficient to receive the hemispherical portions of the spherical alignment elements 180, a pair of alignment pins 282 that fit into the conical depressions 182, and a pair of magnets 284 that are aligned with the depressions. The magnets 184 and 284 are orientated such that the magnets associated with head unit 152 and the magnets associated with head unit 252 will be attracted to one another, while the interaction between the spherical alignment elements 180 and the depressions 280 will provide a rough alignment and the interaction between the conical depressions 182 and the alignment pins 282 will provide fine alignment. This arrangement results in a self-aligning connection of the head units 152 and 252 generally, and the optical interfaces 178 and 278 in particular, when the head units are brought into close enough proximity to one another for the magnetic attraction to be effective despite minor misalignments, as is shown in FIGS. 27A and 27B. In other implementations, such as those in which the proximity couplers employ a direct electrical connection, electrical connectors may be used in place of the optical interfaces.

The magnets 184 and 284 in the illustrated embodiment and, accordingly, the magnetic attraction and associated relative movement of head units 152 and 252 occurs "automatically," i.e. without any additional electrical or mechanical actuation performed by the system 10 or the person inserting the blade(s) into the enclosure 12. Additional actuation, such as actuation in response to the connector assemblies 120 and 220 coming into alignment with one another, may occur in those instances where the magnets are electromagnets or other devices (e.g. servos) are employed.

Figure 28:
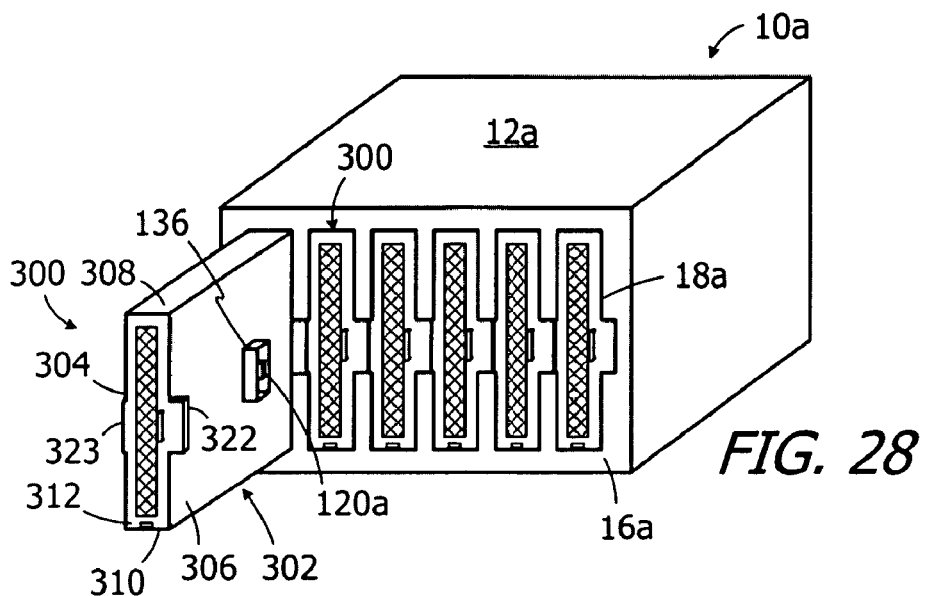
FIG. 28 is a front perspective view of a blade server in accordance with one embodiment of a present invention.
Figure 29:
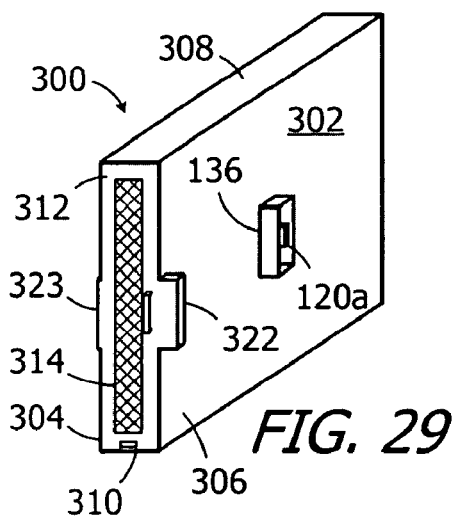
FIG. 29 is a front perspective view of a server blade in accordance with one embodiment of a present invention.
Figure 30:
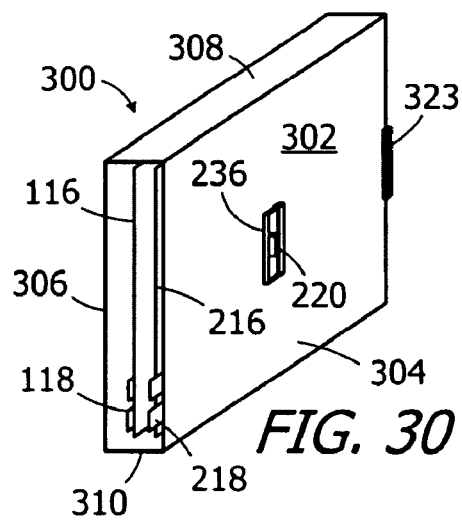
FIG. 30 is a rear perspective view of the server blade illustrated in FIG. 29.
Figure 31:
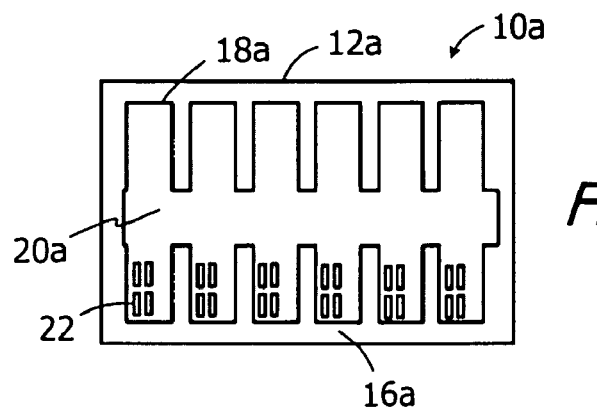
FIG. 31 is a front view of a blade server enclosure in accordance with one embodiment of a present invention.

Another example of a blade server in accordance with one embodiment of a present invention is generally represented by reference numeral 10a in FIG. 28. The exemplary blade server 10a includes a plurality of blades 300 that may be removably mounted within an enclosure 12a. Each of the blades 300 is configured to be connected to two adjacent blades as well as to the remainder of the server 10a. To that end, and as illustrated in FIGS. 29 and 30, each blade 300 includes a housing 302, which consists essentially of side walls 304 and 306, a top wall 308, a bottom wall 310, and a front wall 312 with an inlet 314. Each blade 300 also includes a pair of circuit boards 116 and 216 that may be connected to one other with an internal cable or other suitable instrumentality, various ASICs and/or other electronic components (not shown) on the circuit boards, electrical connectors 118 and 218 (power and/or data) that connect the boards to the remainder of the server 10a by way of enclosure connectors 22 (FIG. 31), and connector assemblies 120a and 220 that connect the blades to an adjacent blades. The connector assembly 120a is substantially similar to connector assembly 120 but for the fact that the overall length connection/suspension system 154 (FIG. 18) has been reduced in order to accommodate the modified positioning of the circuit board 116 within the housing 300. For example, compression springs that are located along side the posts 166 may be employed in place of the tension springs 174 (FIG. 18) to reduce the overall length connection/suspension system 154. The connector assemblies 120a and 220 are positioned relative to the remainder of the blades 300 such that they will be aligned with one another when the blades are fully inserted into the server enclosure 12a in the manner illustrated in FIG. 28. The server enclosure 10a, which is otherwise identical to the server enclosure 10, includes front wall 16a with an opening 18a that is configured to receive a plurality of blades 300. The opening 18a has a central area 20a that permits passage of the connector assemblies 120 and 220 and is sealed by housing flanges 322 and 323 after the blades 300 have been fully inserted into the enclosure 12a.

Although the present inventions have been described in terms of the preferred embodiments above, numerous modifications and/or additions to the above-described preferred embodiments would be readily apparent to one skilled in the art. By way of example, but not limitation, as an alternative to or in addition to the connector assemblies illustrated above in the context of FIGS. 1-31, similar connector assemblies may carried on the top and bottom walls of the blade housings to facilitate direct blade to blade connection blade in other directions. It is intended that the scope of the present inventions extend to all such modifications and/or additions.

We claim:

1. A data processing module, comprising:
   a module housing including an interior and a module housing wall defining an exterior surface;
   at least one circuit board located within the housing; and
   at least one connector assembly including a connector assembly housing carried by the module housing wall and projecting outwardly from the module housing wall and a proximity coupler associated with the connector assembly housing and operably connected to the at least one circuit board; and
   wherein the location of the connector assembly housing is such that the connector assembly will face a connector assembly of a second data processing module and be aligned with the connector assembly of the second data processing module when the data processing module and the second data processing module are fully inserted into an enclosure.

2. A data processing module as claimed in claim 1, wherein the module housing comprises a server blade housing.

3. A data processing module as claimed in claim 1, wherein the connector assembly housing includes a cover movable between an open orientation and a closed orientation.

4. A data processing module as claimed in claim 1, wherein the proximity coupler includes a base unit mounted on the printed circuit board and a head unit that is movable between a first position within the connector assembly housing and a second position at least partially out of the connector assembly housing.

5. A data processing module as claimed in claim 1, wherein the proximity coupler comprises an optical proximity coupler.

6. A data processing module as claimed in claim 1, wherein the proximity coupler comprises a self-aligning proximity coupler.

7. A data processing module as claimed in claim 1, further comprising:
   a resilient EMC gasket that extends around the connector assembly housing and is mounted on the exterior surface of the module housing wall.

8. A data processing system, comprising:
   first and second data processing modules, each data processing module including
   a module housing including an interior and a module housing wall defining an exterior surface,
   at least one circuit board located within the housing, and
   at least one connector assembly including a connector assembly housing carried by the module housing wall and projecting outwardly from the module housing wall and a proximity coupler associated with the connector assembly housing and operably connected to the at least one circuit board; and
   an enclosure configured to receive the first and second data processing modules;
   wherein the configurations of the module housings and the enclosure, and the location of the connector assembly housings, are such that the connector assemblies will face one another and be aligned with one another when the first and second data processing modules are fully inserted into the enclosure.

9. A data processing system as claimed in claim 8, wherein the first and second data processing modules comprise first and second server blades.

10. A data processing system as claimed in claim 8, wherein the enclosure includes enclosure electrical connectors; and
    the first and second data processing modules each include an electrical connector that connects to an enclosure electrical connector when the first and second data processing modules are fully inserted into the enclosure.

11. A data processing system as claimed in claim 8, wherein the connector housings each include a cover movable between an open orientation and a closed orientation; and
    the cover associated with the first data processing module is configured to open the cover associated with the second data processing module as the first and second data processing modules move into alignment with one another.

12. A data processing system as claimed in claim 8, wherein the proximity couplers each include a base unit mounted on the printed circuit board and a head unit.

13. A data processing system as claimed in claim 8, wherein the head unit on the first data processing module is movable between a first position within the connector housing on the first data processing module and a second position that is at least partially within the connector housing on the second data processing module.

14. A data processing system as claimed in claim 8, wherein the proximity couplers comprise self-aligning proximity couplers.

15. A data processing system as claimed in claim 8, wherein the first data processing module includes a first resilient EMC gasket that extends around the connector assembly housing and is mounted on the exterior surface of the housing wall;
    the second data processing module includes a second resilient EMC gasket that extends around the connector assembly housing and is mounted on the exterior surface of the housing wall; and
    the configurations of the module housings and the enclosure, and the location of the first and second EMC gaskets, are such that the first and second EMC gaskets will be aligned with one another and will compress one another when the first and second data processing modules are fully inserted into the enclosure.

16. A data processing system, comprising:
    a first data processing module including a module housing and a data connector at least partially mounted on the housing;

a second data processing module including a module housing and a data connector at least partially mounted on the housing; and an enclosure configured to receive the modules;

wherein the configuration of the module housings and the enclosure, and the location of the data connectors, are such that data connectors will face one another and be aligned with one another when the first and second data processing modules are fully inserted into the enclosure; and wherein a portion of the data connector on the first data processing module is configured to move towards the data connector on the second data processing module when the first and second data connectors are aligned with one another.

17. A data processing system as claimed in claim 16, wherein the data connectors are magnetically attracted to one another.

18. A data processing system as claimed in claim 17, wherein the data connector on the first data processing module includes a spring that opposes the magnetic attraction.

19. A data processing system as claimed in claim 16, wherein the first and second data processing modules comprise first and second server blades.

20. A data processing system as claimed in claim 16, wherein the first and second data connectors include self-aligning proximity couplers.

* * * * *